Oct. 29, 1968

W. D. SMITH 3,408,578

AUTOMATIC GAIN CONTROL CIRCUIT

Filed Oct. 20, 1965

INVENTOR.
WILLIAM D. SMITH

BY Donald F. Voss

ATTORNEY

United States Patent Office 3,408,578

Patented Oct. 29, 1968

3,408,578

AUTOMATIC GAIN CONTROL CIRCUIT

William D. Smith, Rochester, Minn., assignor to International Business Machines Corporation, Armonk, N.Y., a corporation of New York Filed Oct. 20, 1965, Ser. No. 498,275
5 Claims. (Cl. 328—67)

ABSTRACT OF THE DISCLOSURE

An automatic gain control circuit is provided for fixing a current level in a photoelectric cell. A storage capacitor is connected to the base of a control transistor which in turn is connected in series with the photoelectric cell. The capacitor is initially discharged and then charged to a level where the collector of the transistor is at a desired value. The collector current is sensed by an AC amplifier and Schmitt trigger. The triggering of the Schmitt trigger discontinues the charging of the capacitor.

The invention relates to automatic gain control circuits and more particularly to an automatic gain control circuit for automatic adjustment of current through a current conducting device to provide an output signal at a desired voltage level.

Devices such as light responsive elements or photoelectric cells have an output voltage which is dependent upon the current flowing therethrough. By varying or controlling the amount of current flowing, a desired voltage level can be maintained.

In this invention, a current conducting device is connected to control the amount of current flowing through the device to be controlled. The current in the control device is directly proportional to an applied voltage which is stored on a capacitor. The stored voltage is proportional to the desired output voltage level.

The invention finds particular utility for automatically controlling the flow of current through a photoelectric cell incorporated in a blood pressure measuring transducer. The transducer includes a cuff which is adapted to be pressurized for the purpose of occluding flow of blood in the finger or other suitable member of a patient or subject. Pressure in the cuff is permitted to fall off linearly at a controlled rate. When the pressure reaches a level where blood can flow, the amount of transmitted light from a light source in the transducer through the finger to the photoelectric cell changes. The photoelectric cell develops an electrical voltage pulse in response to this change in transmitted light. The amplitude of the voltage pulse is directly proportional to the current in the photoelectric cell. Prior to each blood pressure measurement, the current in the photoelectric cell is set to give the desired voltage output. A storage capacitor, which has a voltage level that is applied to the base of a control transistor connected in series with the photoelectric cell, is initially discharged and then charged to a level where the collector current of the transistor reaches a desired value. This value is sensed through the facility of an AC amplifier and a Schmitt trigger. Blood pressure measurements are then made with current in the photoelectric cell set at the desired level.

Accordingly, a principal object of this invention is to provide an improved automatic gain control circuit.

A more specific object of this invention is to provide an automatic gain control circuit which controls the current in the device to be controlled.

Another more specific object of the invention is to provide an automatic gain control circuit which incorporates a current controlling element whose current is directly proportional to an applied voltage from a storage capacitor.

Still another object of the invention is to provide an automatic gain control circuit which is simple and inexpensive.

The foregoing and other objects, features and advantages of the invention will be apparent from the following more particular description of a preferred embodiment of the invention, as illustrated in the accompanying drawings.

Figure 1:
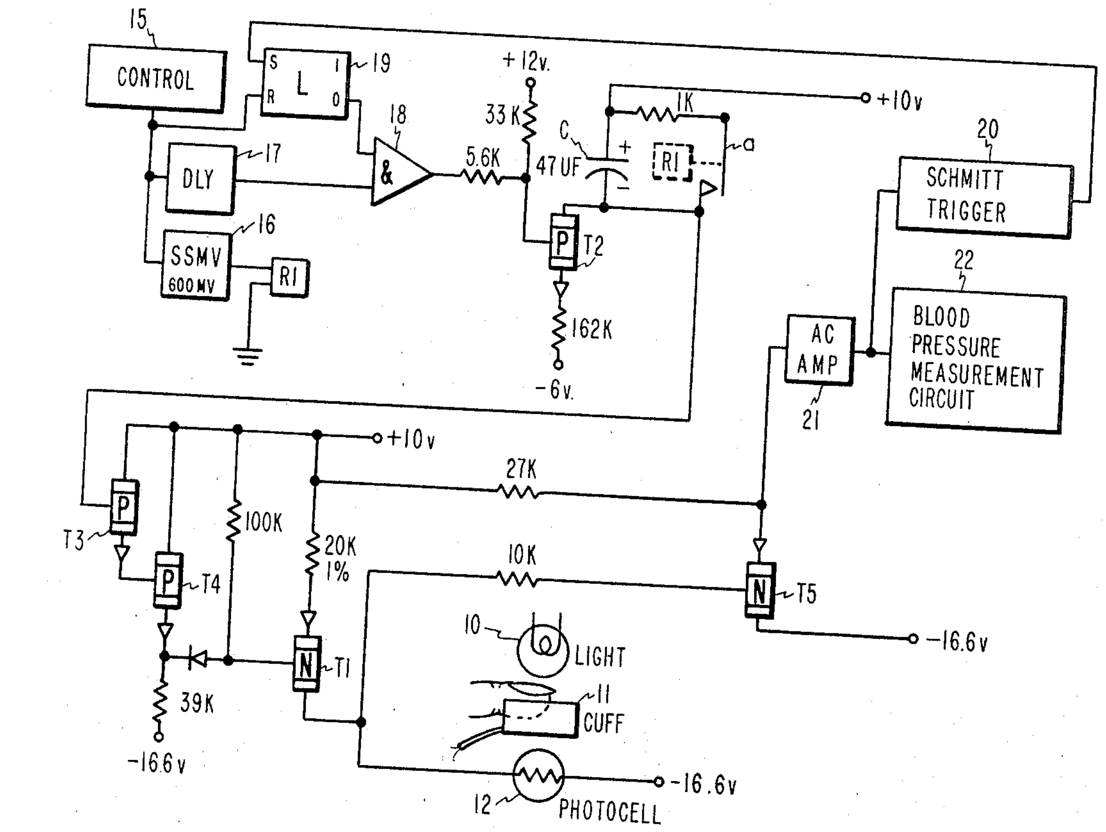
FIG. 1 is a schematic circuit diagram of an embodiment for the invention.

With reference to the drawings and particularly to FIG. 1, the invention is illustrated by way of example as an automatic gain control circuit for controlling the current in photocell 12. Of course, the invention is applicable to other devices having an output voltage which is dependent upon the current through the device. A thermistor is another type of device whose current can be controlled by the automatic gain control circuit of this invention. Photocell 12 together with light source 10 and cuff 11 are part of a transducer for measuring blood pressure in the manner shown and described on page 85 of the IBM Technical Disclosure Bulletin, Volume 6, No. 1, dated June 1963. A blood pressure measuring system in which this invention also can be incorporated is shown and described in U.S. patent application,, Ser. No. 347,-212, filed February 25, 1964, now Patent No. 3,374,461 for Physiological Monitoring System by F. R. Anderholm et al. and assigned to the same assignee as the present invention.

At the time a blood pressure measurement is to be made, control 15 generates a signal which is applied to singleshot multivibrator 16, delay 17 and the reset input terminal of latch 19. The singleshot multivibrator 16 provides a signal for energizing relay R1 for a predetermined period of time. With relay R1 energized, contact R1A is closed and capacitor C is initially discharged to produce minimum current through photocell 12. When singleshot multivibrator 16 times out, relay R1 is de-energized and contact R1A opened. Delay 17 functions to delay the signal from control 15 to permit the capacitor C to be discharged. After a predetermined time delay, logical AND circuit 18 receives a signal from delay 17 and will pass this signal to the base of transistor T2 if latch 19 is in the reset state. Latch 19 is initially reset by the signal from control 15. With a positive going signal applied to the base of T2, it conducts and capacitor C charges negatively. The voltage on capacitor C is applied through a double emitter follower formed by transistors T3 and T4 to the base of transistor T1. Transistors T3 and T4 are connected in the well-known Darlington configuration and function as a buffer circuit to enable driving T1 without loading capacitor. The amount of voltage applied to the base of transistor T1 controls the flow of current therethrough and the flow of current through photocell 12 which is connected in the collector circuit of T1. The current flowing through photocell 12 is passed to pulse amplifier 21 via impedance matching transistor T5. The amplified signal is then applied to Schmitt trigger 20. Schmitt trigger 20 switches at a predetermined desired voltage level and upon being switched, it sets latch 19. With latch 19 set, capacitor C will no longer charge, however, the voltage level of capacitor C continues to be applied to the base of transistor T1 when blood pressure measurement are made.

Figure 2:
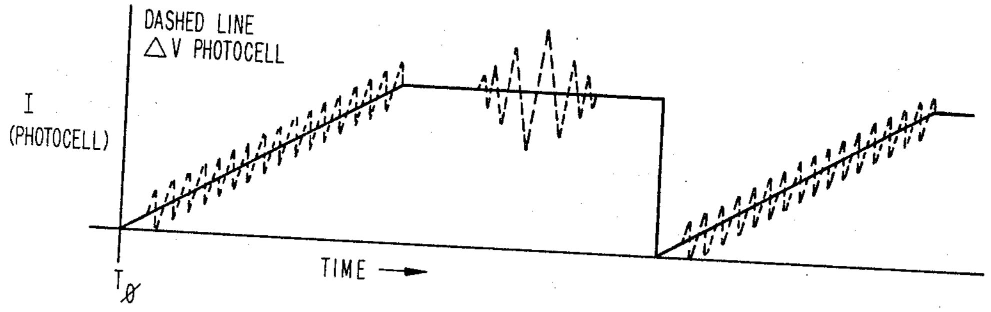
FIG. 2 is a waveform diagram showing the current in the photocell of FIG. 1 at different points in time.

With reference to FIG. 2, the current in photocell 12 is at a minimum at T0 time which corresponds to the time capacitor C is discharged. As capacitor C charges, the current in photocell 12 increases as shown by the solid line until Schmitt trigger 20 is switched whereby latch 19 becomes set. The current in photocell 12 is then set at a desired level. The pulses shown by the dashed line are caused by the fluctuations in light impinging upon photocell 12 due to the flow of blood in the finger prior to occlusion. After the current in photocell 12 reaches the desired level as detected by Schmitt trigger 20, cuff 11 is pressurized whereby the flow of blood in the finger is occluded. Thus, no pulses are seen at the desired level until after the pressure in the cuff is decreased to a level whereby blood can flow relative to the finger. The first pulse detected indicates when systolic blood pressure occurs and the peak pulse is indicative of the occurrence of diastolic blood pressure. These pulses are passed by amplifier 21 to blood pressure measuring circuit 22 which is of the type described in the referenced Anderholm et al. application.

The cycle for discharging the capacitor C and then charging it to a desired level repeats as control 15 generates another signal. Control 15 can be any suitable device for generating signals at desired time intervals.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. An automatic gain control circuit comprising:

a voltage controllable current conducting element connectable to control current in a device to be controlled;

voltage applying means connected to said current conducting device to first apply a varying voltage and second to apply a voltage at a predetermined level thereto; and means connected to said current conducting element and said voltage applying means and responsive to the amount of current flowing in said current conducting element to cause said voltage applying means to cease applying said varying voltage and apply said voltage at a predetermined level to said current conducting element.

2. The automatic gain control circuit of claim 1 wherein said voltage controllable current conducting element is a transistor.

3. The automatic gain control circuit of claim 1 wherein said voltage applying means comprises a storage capacitor and means for first discharging said storage capacitor and then applying thereto a varying voltage until the charge thereon reaches a predetermined level as determined by said detecting means.

4. An automatic gain control circuit comprising:

a voltage controllable current conducting element connectable to control current in a device to be controlled;

a capacitor connected to said current conducting element to apply a control voltage thereto;

selectively operable capacitor charging means connected to said capacitor;

means connected to said capacitor for selectively discharging the same;

control means for first operating said means to discharge said capacitor and then operating said means for charging said capacitor; and detecting means connected to said current conducting element and said capacitor charging means and responsive to a predetermined amount of current flowing in said current conducting element to terminate operation of said capacitor charging means.

5. In an automatic gain control circuit:

a device having an output voltage which is dependent upon the current therein;

a voltage controllable current conducting element connected to said device to control current therein;

voltage applying means connected to said current conducting device, first to apply a varying voltage and second to apply a voltage at a predetermined level thereto; and detecting means connected to said current conducting element and said voltage applying means and responsive to a predetermined amount of current flowing in said device to cause said voltage applying means to cease applying said varying voltage and apply said voltage at a predetermined level to said current conducting element.

References Cited

UNITED STATES PATENTS

| | | | |
|---|---|---|---|
| 2,836,766 | 5/1958 | Halsted | 250—211 X |
| 2,877,355 | 3/1959 | Young | 250—211 |

FOREIGN PATENTS

| | | |
|---|---|---|
| 613,682 | 12/1948 | Great Britain. |

JAMES W. LAWRENCE, *Primary Examiner.*

V. LAFRANCHI, *Assistant Examiner.*